(12) United States Patent
Shih

(10) Patent No.: US 6,557,385 B1
(45) Date of Patent: May 6, 2003

(54) SAFETY AND ANTI-THEFT DOOR GUARD FOR A SERVER

(76) Inventor: Shoei-Yuan Shih, No. 8, Lane 85, Hsing-I Rd., Pei-Tou Dist., Taipei (TW)

( * ) Notice: Subject to any disclaimer, the term of this patent is extended or adjusted under 35 U.S.C. 154(b) by 0 days.

(21) Appl. No.: 10/014,543

(22) Filed: Dec. 14, 2001

(51) Int. Cl.⁷ .............................................. B65D 55/14
(52) U.S. Cl. ........................... 70/161; 70/159; 70/162; 16/366; 312/223.1; 174/66; 361/726
(58) Field of Search ...................... 70/159–162; 16/389, 16/392; 312/223.1, 223.2, 265.6; 361/724, 725, 726, 727; 174/66; 220/818, 819, 826, 833

(56) References Cited

U.S. PATENT DOCUMENTS

| | | | | |
|---|---|---|---|---|
| 255,809 A | * | 4/1882 | Pfauntz et al. ................. | 16/366 |
| 1,031,745 A | * | 7/1912 | Unckrich ..................... | 16/366 |
| 3,131,330 A | * | 4/1964 | Allen ......................... | 361/724 |
| 4,248,069 A | * | 2/1981 | Burbank ....................... | 70/160 |
| 4,486,919 A | * | 12/1984 | Schoenke ..................... | 16/366 |
| 4,898,009 A | * | 2/1990 | Lakoski et al. ................ | 70/58 |
| 5,407,126 A | * | 4/1995 | Coultas et al. ................ | 232/17 |
| 5,479,341 A | * | 12/1995 | Pihl et al. ..................... | 700/79 |
| 5,493,760 A | * | 2/1996 | Takimoto ..................... | 16/366 |
| 5,598,323 A | * | 1/1997 | Muller ........................ | 361/726 |
| 5,659,929 A | * | 8/1997 | Cheng ......................... | 16/366 |

* cited by examiner

*Primary Examiner*—Anthony Knight
*Assistant Examiner*—Christopher Boswell
(74) *Attorney, Agent, or Firm*—Bacon & Thomas, PLLC

(57) ABSTRACT

A safety and anti-theft door guard for a server provides an improved door guard opening and closing structure for servers of 1U, 2U and 2U up specifications. The door guard of the invention offers a two-stage turning mechanism to allow hard disk drives retrievable from the server freely with interference, and also has a lock means installable on any type of models to provide theft protection function, thereby to resolve the problem of conventional single shaft door opening that might otherwise impede the retrieval of hard disk drives from the server.

7 Claims, 8 Drawing Sheets

SAFETY AND ANTI-THEFT DOOR GUARD FOR A SERVER

FIELD OF THE INVENTION

The present invention relates to a safety and ant-theft door guard for a server and particularly a door guard adapted for use in servers that conform to standard 1U, 2U, and 2U up specifications,

BACKGROUND OF THE INVENTION

In general, telecommunication industry or research institutions require computers to process huge amount of data, such as analysis for telephone address, DNA sequencing, or weather forecast simulation, etc. The computers being used not only have very powerful processing units, they also have large memory units. These computers often are called servers. The servers usually have a plurality of retrievable hard disk drives located at the front end of the servers for users to remove and replace whenever needed. In order to prevent the hard disk drives from stolen, the retrieval means has equipped with a lock means to allow operators to remove and replace the hard disk drives with keys. However, to equip every hard disk drive with a lock means increases the cost and space.

To improve the concern of theft protection set forth above, some producers have developed door guards equipped with a lock means to replace the lock means on each hard disk drive. Then a server needs only one door guard to protect all the hard disk drives in the server. This approach can reduce cost and save internal space.

The contemporary techniques being adopted for the door guard design mainly have two types: one technique employs pivotal means to fasten the door guard to the housing opening of the server, and another technique has a latch element 11a located on each of two sides of the door guard 1a as shown in FIG. 1. The housing opening of the server has two latch notches located at two sides matching and engageable respectively with the latch element 11a such that the door guard 1a may be fastened to the server. Users may open the door guard 1ato retrieve the hard disk drive when desired. However both techniques still have many problems when put in practical use, notably:

1. The door guard equipped with the pivotal means must have a pivotal shaft, and the face panel of the server should have a matching pivotal section for fastening. As a result, additional space is required. For the servers of 1U specification that already contain the retrievable hard disk drives, this technique is not applicable to the face panel. Moreover, the door guard 1ahas a certain thickness. Turning the door guard through the pivotal means will cause jam and interference with the neighboring door guard of the server.
2. The door guard equipped with the latch element may be adopted for servers of 1U specification. However, due to structural restrictions, lock means cannot be installed on the door guard. Thus there is no theft protection function.

SUMMARY OF THE INVENTION

The primary object of the invention is to resolve the foregoing disadvantages. The invention includes a frame and a lock means located on the frame and a latch element located on a server. The frame has two sides each has a pivotal means which includes a first pivotal lever and a second pivotal lever. The first pivotal lever has a first stub shaft pivotally engaged with the frame and a second pivotal stub shaft located at another end thereof to engage with the second pivotal lever. The second pivotal lever is fastened to the server. By means of the first and second pivotal stub shaft of the pivotal means, the frame may be turned in a two-stage manner without impeding retrieval of the hard disk drives and opening of the adjacent door guard. And through the lock means and latch element, an anti-theft effect can be achieved.

Another object of the invention is to resolve the neighboring door guard jamming and interference problem incurred to the conventional pivotal coupling. The invention employs the first and second pivotal stub shafts to allow the frame pulling open in parallel then lifting upward, thus prevents adjacent door guards from jamming and interfering.

A further object of the invention is to employ the first and second pivotal stub shafts to allow the frame pulling open in parallel then lifting upward to completely move away from the server face panel so that the face panel space can be fully utilized to facilitate retrieval of hard disk drives and installation of other devices.

Yet another object of the invention is to provide the lock means on the door guard frame which has a dual-shaft pivotal means so that the door guard may be installed on the sever of 1U specification to facilitate opening of the door guard and achieve anti-theft function.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
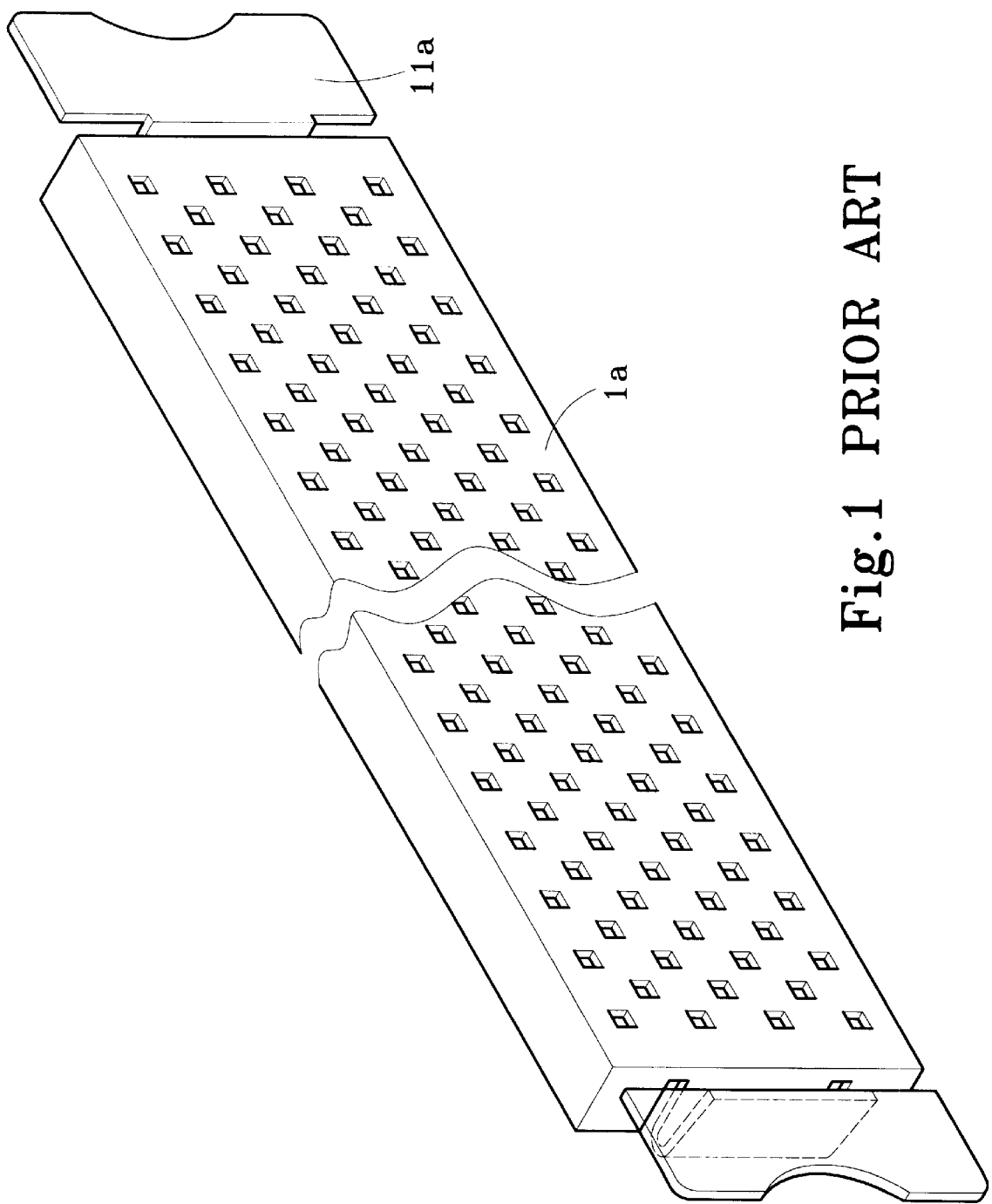
FIG. 1 is a schematic view of a conventional latch type door guard for a server 3.
Figure 2:
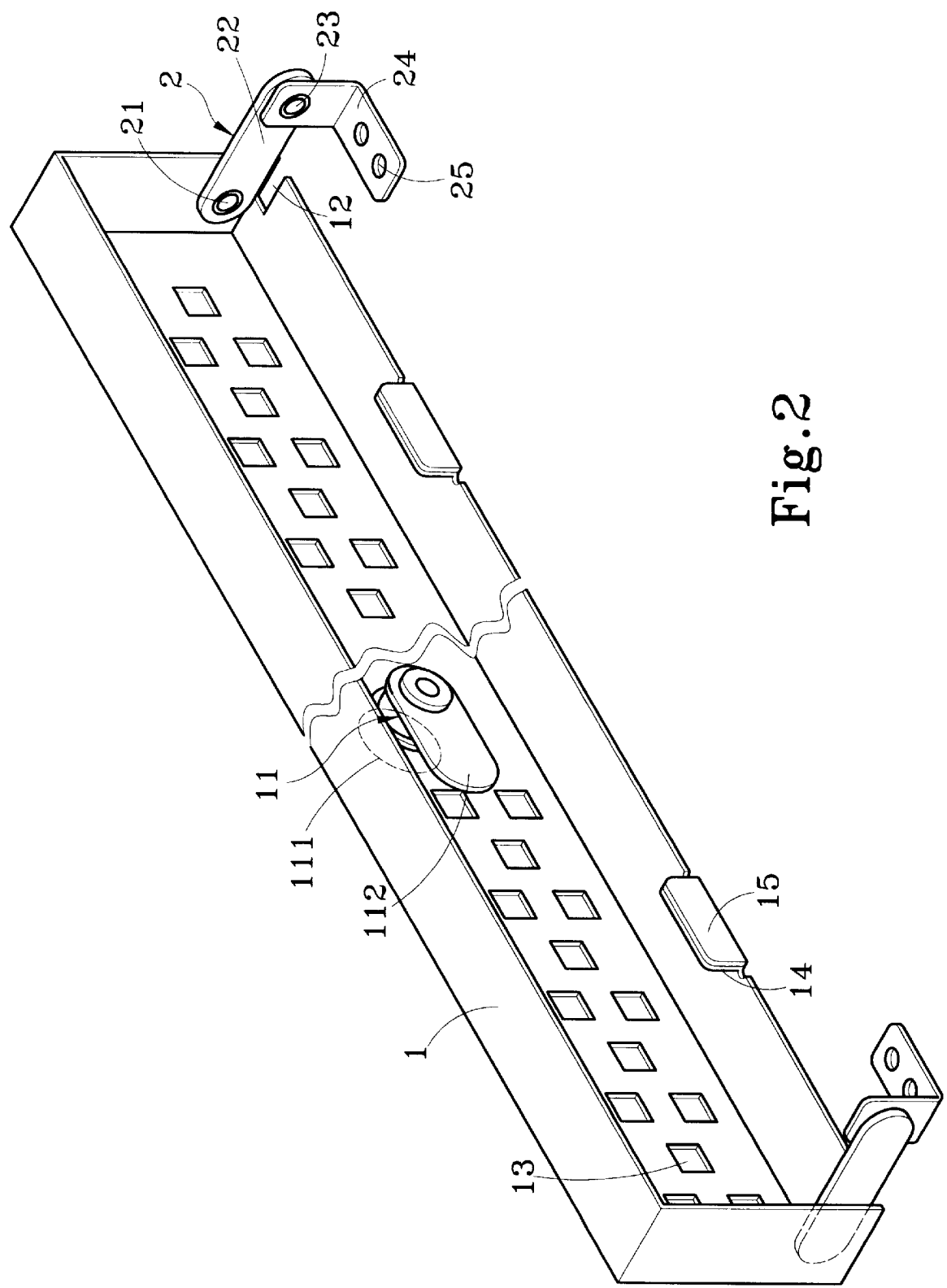
FIG. 2 is a perspective view of the invention.
Figure 3:
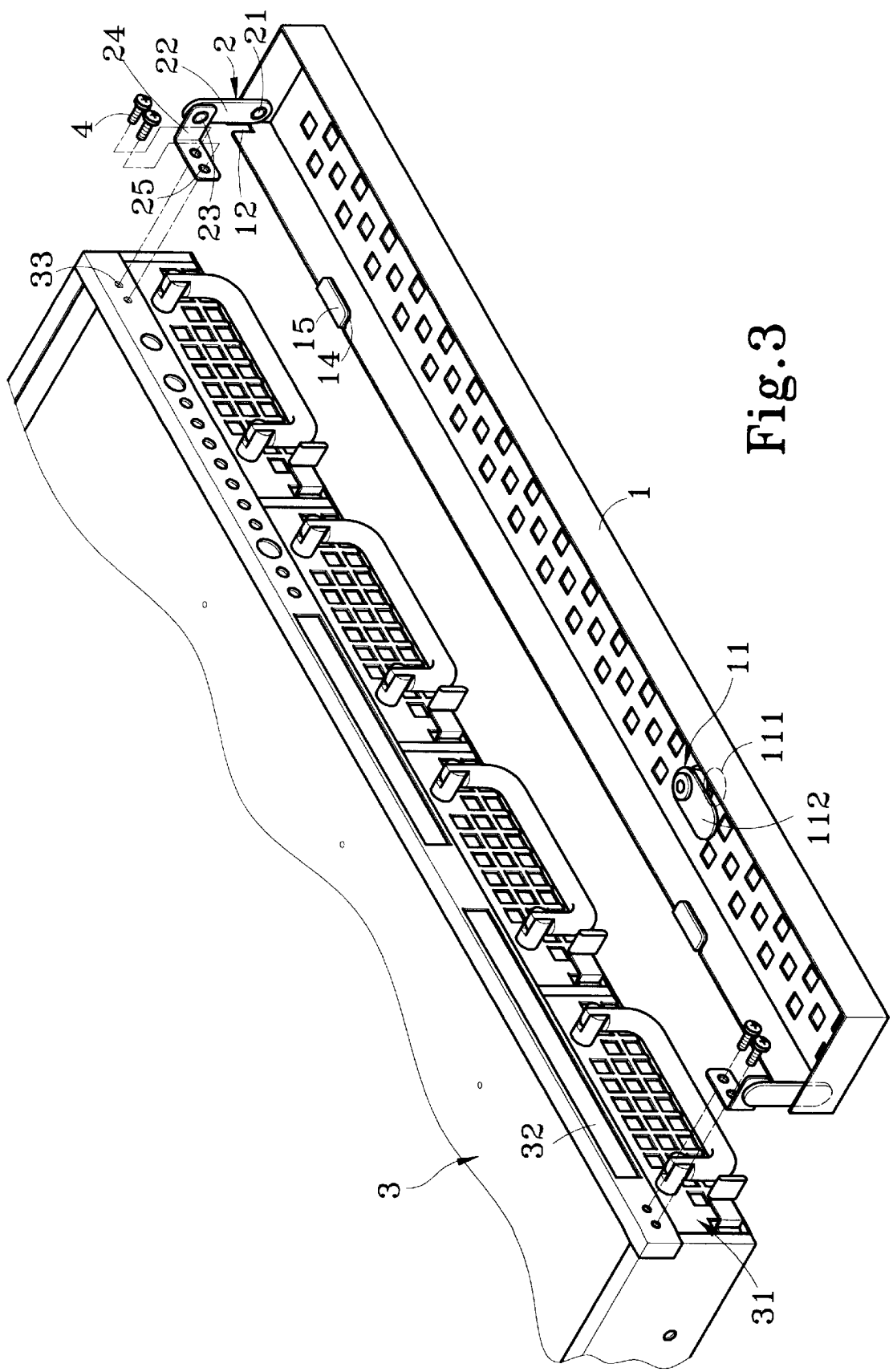
FIG. 3 is a schematic view of the invention in use.
Figure 4A:
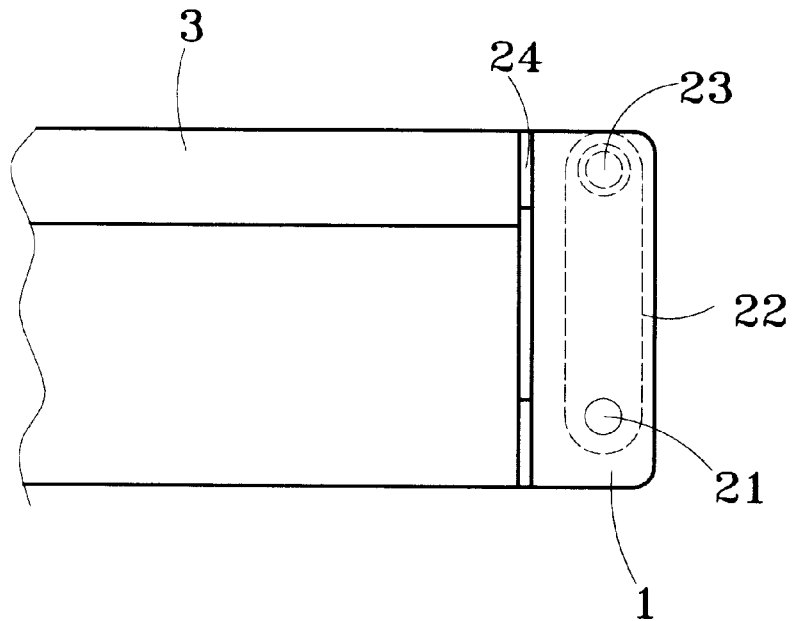
FIGS. 4A. 4B, 4C and 4D are schematic views of the invention in use.
Figure 4B:
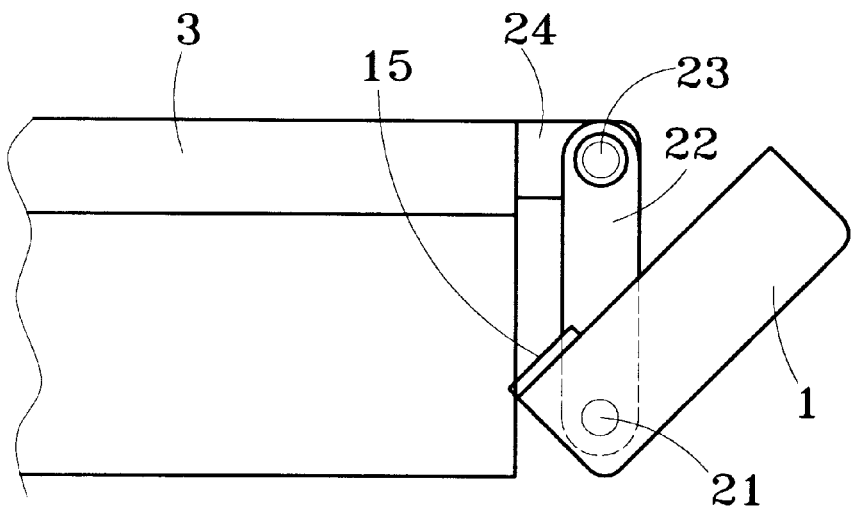
Figure 4C:
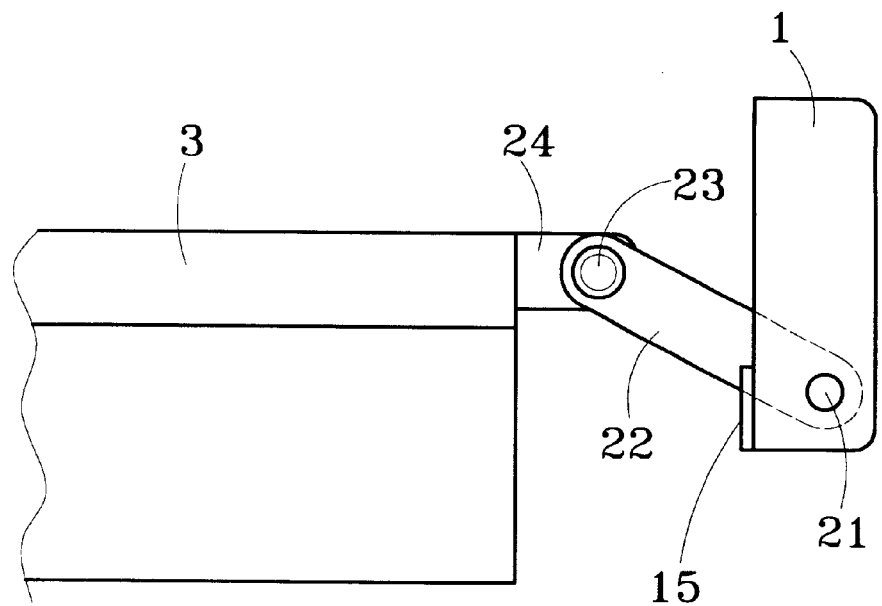
Figure 4D:
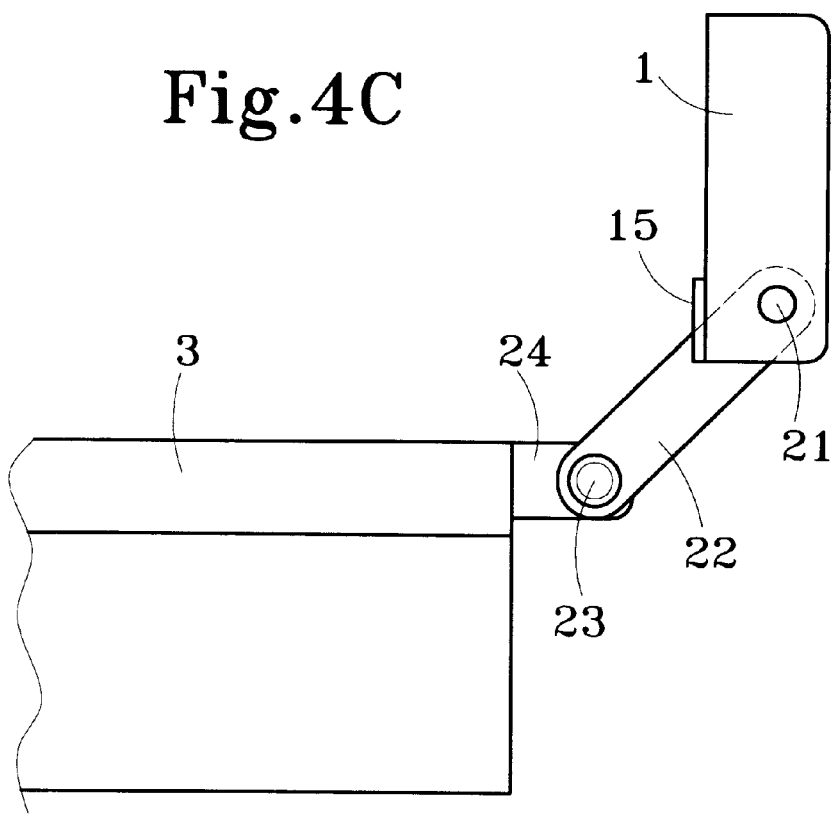
Figure 5A:
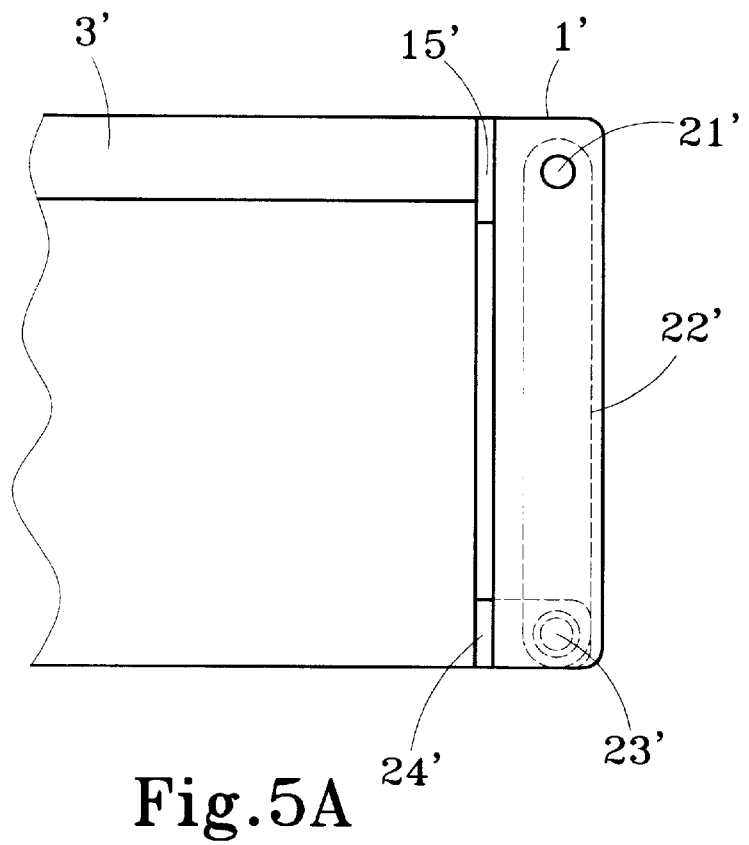
FIGS. 5A. 5B, 5C and 5D are schematic views of another embodiment of the invention in use.
Figure 5B:
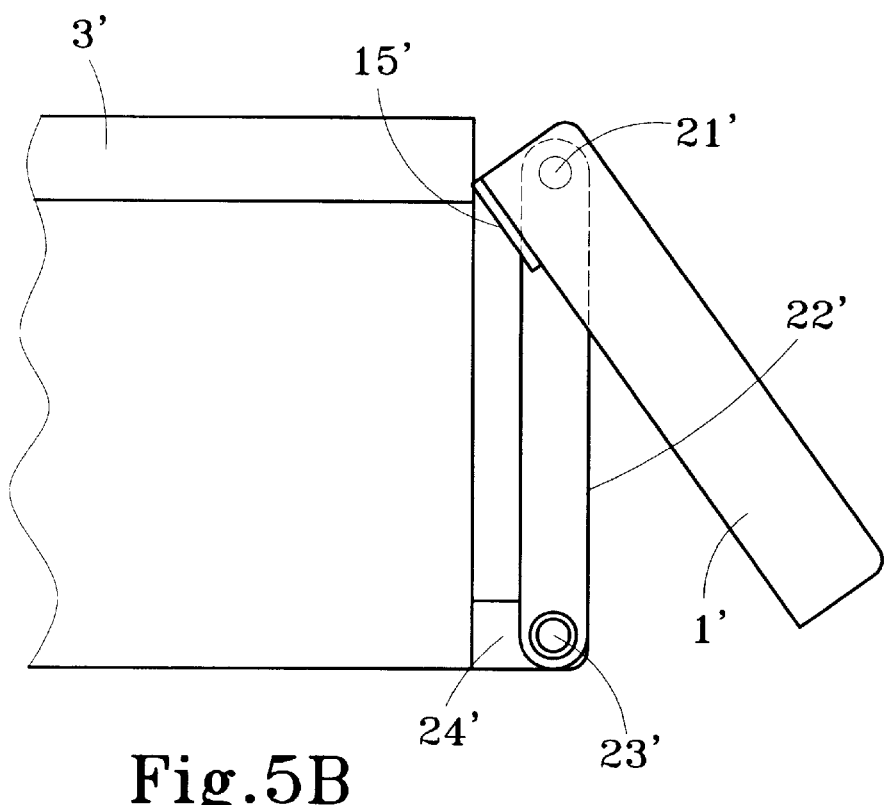
Figure 5C:
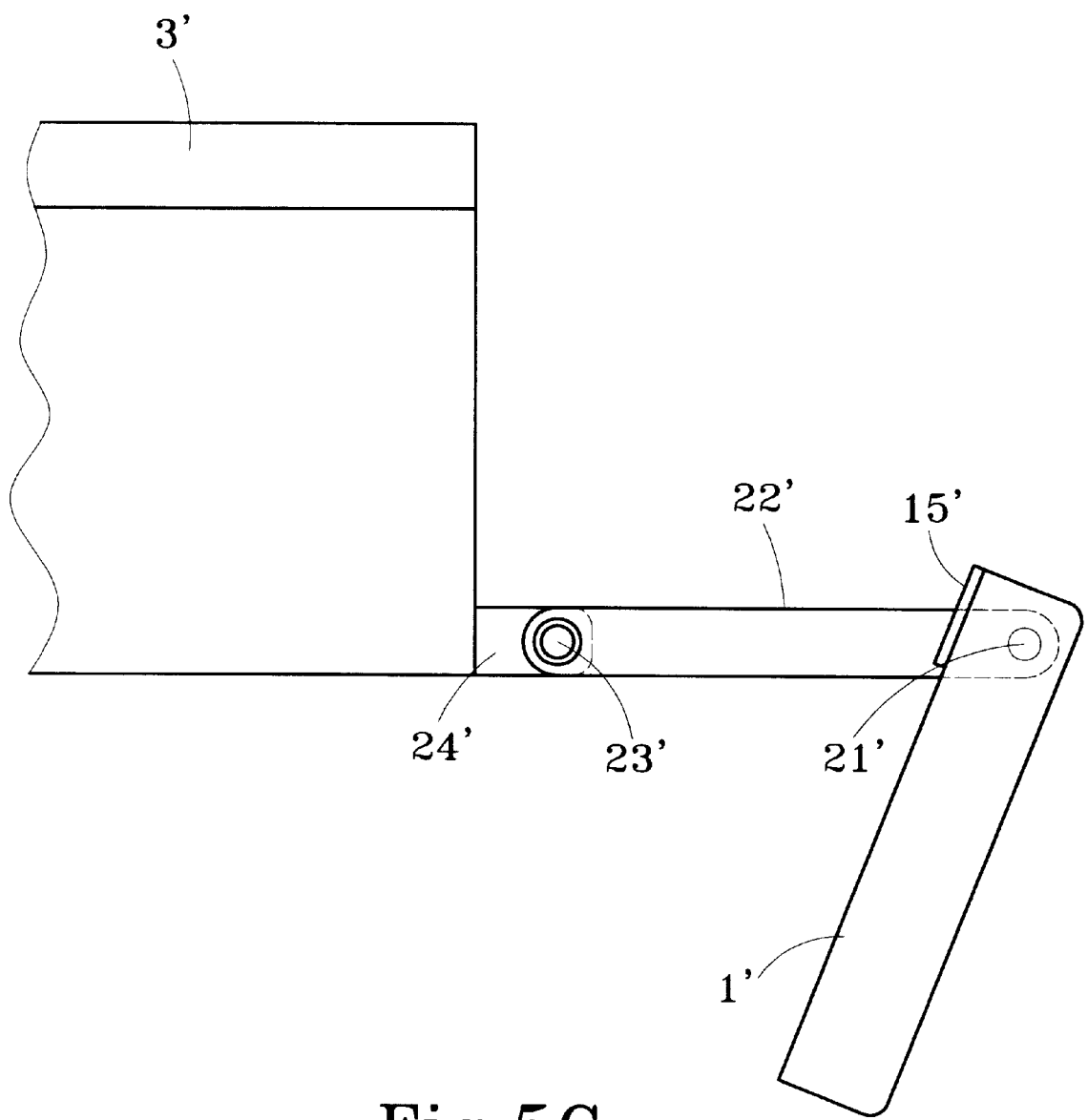
Figure 5D:
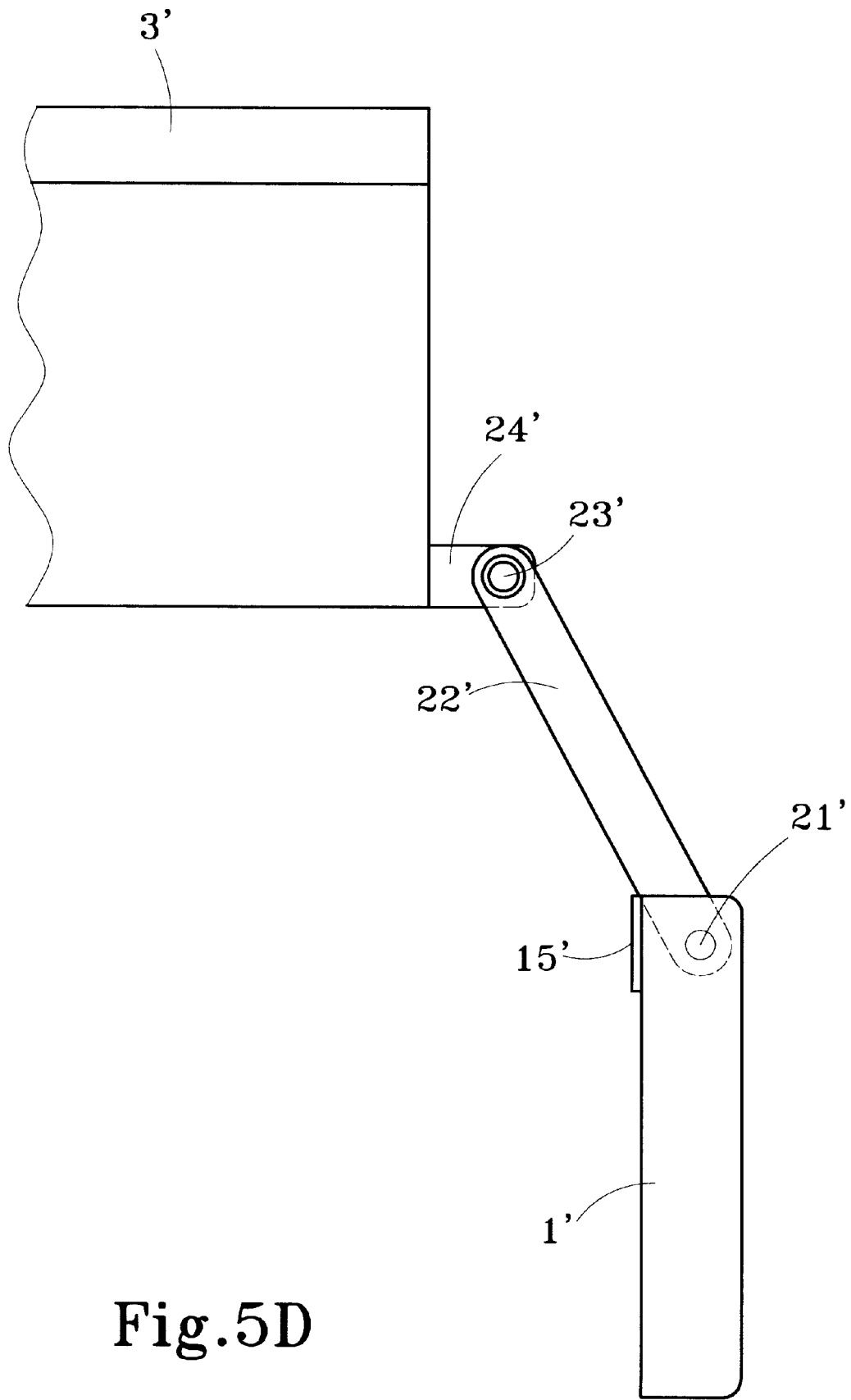

Referring to FIGS. 2 and 3, the invention is a safety and anti-theft door guard adapted for use in a server 3, and mainly includes a frame 1 matching to the width of the server 3. The frame 1 has a lock means 11 located thereon. The server 3 has a latch element 32 located thereon. The frame 1 has two sides each has a pivotal means 2. The pivotal means 2 includes a first pivotal lever 22 and a second pivotal lever 24. The first pivotal lever 22 has a first pivotal stub shaft 21 pivotally engaged with the frame 1 and a second pivotal stub shaft 23 located at another end thereof to engage with the second pivotal lever 24 which is fastened to the server 3. Each of the two sides of the frame 1 corresponding to the first pivotal lever 22 has a notch 12 to accommodate the first pivotal lever 22 when in use. The first and second pivotal stub shafts 21, 23 of the pivotal means 2 allow the frame 1 to turn in a two-stage manner so that retrieval of the hard disk drives and opening of adjacent door guards won't be affected. The lock means 11 and latch element 32 also can prevent the hard disk drives from stolen.

The lock means 11 mainly includes a lock opening 111 formed on an outer side of the frame 1 and a lock tongue 112 located at an inner side of the frame 1. The latch element 32 is an elongated slot corresponding to the lock tongue 112 or a retain flange extending outwards from a face panel 31. The frame 1 further has a plurality of heat radiating apertures 13, and dividers 14 located on the peripheral rim thereof corresponding to the face panel 31 of the server 3. Each divider 14 is bonded to a pad 15 made of an insulation material to isolate static charge that might incur from the abrasion between the frame 1 and the server 3 to protect the hard disk drives or other devices in the server 3.

When in use for the server 3 of 1U specification, the face panel 31 has a hard disk drive retrieval opening located at a lower section thereof. The face panel 31 of the server 3 may have the anchor bores 33 formed on each of two sides thereof to engage with fasten bores 25 located on the second pivotal lever 24. The frame 1 thus may be fastened to the face panel 31 by means of fasten elements 4 engaging with the fasten bores 25 and the anchor bores 33. The lock tongue 112 of the lock means 11 is engageable with the latch element 32. The lock means 11 also provides a latch space for the latch tongue 112. Referring to FIGS. 4A, 4B, 4C and 4D, when there is a desire to open the door guard, turn the frame 1 outwards about the first pivotal stub shaft 21 which is functioned as a fulcrum, and the frame 1 may be lifted upwards about the second pivotal stub shaft 23 which functions as the axis with the first pivotal lever 22 functions as the radius, and the frame 1 may be moved continuously upwards until the first pivotal lever 22 is slipped into the notch 12 and moved to the top end of the frame 1. At that condition, the frame 1 is completely moved away from the position of the face panel 31 of the server 3, and the hard disk drives and other devices may be retrieved freely without jamming or interfering with the adjacent door guards of the frame 1.

For the server 3' of 2U or 3U up specifications, the face panel 31 has more operative space. The anchor bores 33 may be formed on two upper sides of the face panel 31 of the server 3' to engage with fasten bores 25 formed on the second pivotal lever 24' to allow fasten elements 4 to engage with the fasten bores 25 for anchoring a frame 1' on the face panel 31. The face panel 31' also may have a retain flange (not shown in the drawings) extending outwards from the face panel 31corresponding to a lock tongue (not shown in the drawings) to function as a latch element to latch the latch tongue 112. Referring to FIGS. 5A, 5B, 5C and 5D, when there is a desire to open the door guard, turn the frame 1' outwards about the first pivotal stub shaft 21' which is functioned as a fulcrum, and the frame 1' may be moved downwards about the second pivotal stub shaft 23' which functions as the axis with the first pivotal lever 22' functions as the radius, and the frame 1' may be moved continuously downwards until the first pivotal lever 22' is slipped into the notch 12 and moved to the top end of the frame 1'. At that condition, the frame 1' is completely moved away from the position of the face panel 31' of the server 3', and the hard disk drives and other devices may be retrieved freely and conveniently.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments that do not depart from the spirit and scope of the invention.

What is claimed is:

1. A safety and anti-theft door guard for a server comprising a frame which matches the width of the server and has a lock means located thereon engageable with a latch element located on the server, the frame further having two sides each having a pivotal means located thereon, the pivotal means including a first pivotal lever and a second pivotal lever, the first pivotal lever having a first pivotal stub shaft pivotally engaged with the frame and a second pivotal stub shaft located at another end thereof to engage with the second pivotal lever which is fastened to the server, the frame being turnable in a two-stage manner through the first pivotal stub shaft and the second pivotal stub shaft of the pivotal means without effecting retrieval of hard disk drives located in the server and opening of adjacent door guards, and the lock means and the latch element having a latch function to provide a theft protection effect.

2. The safety and anti-theft door guard for a server of claim 1, wherein the server has a face panel that has two sides each having anchor bores located thereon to fasten the second pivotal lever.

3. The safety and anti-theft door guard for a server of claim 1, wherein the lock mean includes a lock opening located on an outer side of the frame and a lock tongue located on an inner side of the frame.

4. The safety and anti-theft door guard for a server of claim 1, wherein the latch element is selectively an elongated slot or a retain flange extending outwards from a face panel corresponding to a lock tongue.

5. The safety and anti-theft door guard for a server of claim 1, wherein the frame has a plurality of heat radiating apertures.

6. The safety and anti-theft door guard for a server of claim 1, wherein the two sides of the frame further have respectively a notch for accommodating the first pivotal lever during operation.

7. The safety and anti-theft door guard for a server of claim 1, wherein the frame further has dividers located on a peripheral rim thereof corresponding to a face panel of the server, each of the dividers being bonded to a pad made of an insulation material.

* * * * *